United States Patent
Nagel et al.

(10) Patent No.: US 11,879,441 B2
(45) Date of Patent: Jan. 23, 2024

(54) WIND TURBINE AND METHOD FOR IMPROVING THE ELECTROMAGNETIC COMPATIBILITY OF A WIND TURBINE

(71) Applicant: Siemens Gamesa Renewable Energy A/S, Brande (DK)

(72) Inventors: Eirik Nagel, Flensburg (DE); John Nieuwenhuizen, Horsens (DK)

(73) Assignee: SIEMENS GAMESA RENEWABLE ENERGY A/S

( * ) Notice: Subject to any disclaimer, the term of this patent is extended or adjusted under 35 U.S.C. 154(b) by 333 days.

(21) Appl. No.: 17/289,982

(22) PCT Filed: Oct. 15, 2019

(86) PCT No.: PCT/EP2019/077875
§ 371 (c)(1),
(2) Date: Apr. 29, 2021

(87) PCT Pub. No.: WO2020/094342
PCT Pub. Date: May 14, 2020

(65) Prior Publication Data
US 2022/0003219 A1    Jan. 6, 2022

(30) Foreign Application Priority Data
Nov. 7, 2018   (EP) .................... 18204826

(51) Int. Cl.
*F03D 13/20*     (2016.01)
*H05K 9/00*      (2006.01)
*F03D 80/80*     (2016.01)

(52) U.S. Cl.
CPC ............. *F03D 80/82* (2016.05); *F03D 13/20* (2016.05); *F03D 80/85* (2016.05); *H05K 9/0081* (2013.01);
(Continued)

(58) Field of Classification Search
CPC .......... F03D 13/20; F03D 80/82; F03D 80/85; H05K 9/0081; H05K 9/0083; F05B 2240/912
See application file for complete search history.

(56) References Cited

U.S. PATENT DOCUMENTS

| 5,786,785 A | 7/1998 | Gindrup et al. |
| 2021/0164448 A1 * | 6/2021 | Nieuwenhuizen ... H05K 9/0073 |

FOREIGN PATENT DOCUMENTS

| CN | 107687399 A | * | 2/2018 |
| CN | 207217973 U | | 4/2018 |

(Continued)

OTHER PUBLICATIONS

International Search Report and Written Opinion of the International Searching Authority dated Jan. 7, 2020 for Application No. PCT/EP2019/077875.

(Continued)

*Primary Examiner* — Audrey B. Walter
(74) *Attorney, Agent, or Firm* — Schmeiser, Olsen & Watts LLP

(57) ABSTRACT

Provided is a wind turbine, including a hollow tower carrying a nacelle, and at least one power electronics component emitting electromagnetic waves during operation, in particular an inverter located at the bottom of the tower, wherein the tower acts as a wave guide for an electromagnetic wave generated by the power electronics component, wherein the tower comprises at least one absorber element at least reducing the transport of the electromagnetic wave of the power electronics component along the tower.

12 Claims, 5 Drawing Sheets

(52) U.S. Cl.
CPC ...... *H05K 9/0083* (2013.01); *F05B 2240/912* (2013.01)

(56) References Cited

FOREIGN PATENT DOCUMENTS

| | | |
|---|---|---|
| EP | 2378850 A1 | 10/2011 |
| WO | 2018135940 A2 | 7/2018 |

OTHER PUBLICATIONS

European Search Report and Written Opinion of the European Searching Authority dated May 23, 2019 for Application No. 18204826.4.

* cited by examiner

WIND TURBINE AND METHOD FOR IMPROVING THE ELECTROMAGNETIC COMPATIBILITY OF A WIND TURBINE

CROSS-REFERENCE TO RELATED APPLICATIONS

This application claims priority to PCT Application No. PCT/EP2019/077875, having a filing date of Oct. 15, 2019, which is based off of EP Application No. 18204826.4, having a filing date of Nov. 7, 2018, the entire contents both of which are hereby incorporated by reference.

FIELD OF TECHNOLOGY

The following relates to a wind turbine, comprising a hollow tower carrying a nacelle, and at least one power electronics component emitting electromagnetic waves during operation, wherein the tower acts as a wave guide for an electromagnetic wave generated by the power electronics component. The following further relates to a method for improving the electromagnetic compatibility (EMC) of a wind turbine.

BACKGROUND

Wave guides for electromagnetic waves are already known in the state of the art and mean at least essentially linear structures that convey electromagnetic waves between the end points. Wave guides are advantageous since no return line is needed, as for example in stripe lines, coaxial cables and so on. Wave guides thus use an outer conductor to transport electrical energy via an electromagnetic wave.

Usually, a wave guide comprises a geometry having conductive or relatively conductive boundaries. Inside this geometry, the electromagnetic wave is able to travel.

Wave guides are characterized by a so-called "cut-off frequency", which is the lowest frequency transported by a wave guide (without needing a return line). Based on the shape of the wave guide, in particular for cylindrical and rectangular wave guides, different formulas for calculation of the cut-off frequency are already known in the state of the art. Additionally, formulae for calculating the wave length of an electromagnetic wave inside a wave guide are already known, as well as for the group velocity and the phase velocity.

Wave guides are employed in different fields of technology, in particular in the microwave technology, for example radar applications, to transport energy. The loss inside a wave guide is very low because of the low dielectric constant $\varepsilon_r$. In vacuum, the relative permittivity $\varepsilon_r$ is equal to 1, in air approximately equal to 1.

On the other hand, wind turbines for onshore and offshore applications have been proposed in the state of the art. Usually, the construction of such a wind turbine is that a tower is used to carry a nacelle having the generator and carrying the hub to which the plates are fixed. At the bottom of the tower, in onshore applications sometimes even below ground, power electronics components, such as an inverter, are provided, which may be electrically connected to the generator via, for example, cables guided inside the tower.

These towers, on the one hand, are often large structures having large diameters of five meters or more. On the other hand, the bulk material of towers of wind turbines often comprise materials which are relatively electrically conductive, such that, in principle, the tower can act as a wave guide. Taking the size of the towers into account, the cut-off frequency of such wind turbine towers can be very low, in the case of a cylindrical tower having a diameter of six meters, for example, even below 30 MHz. This means that the cut-off frequency may lie below operating frequencies of power electronics components housed in or below the lower tower, such that the tower may act as a wave guide for electromagnetic waves generated by operation of the at least one power electronics component. The energy of these electromagnetic waves is then transported to the nacelle, which, in turn, can cause strong radiative emissions from the wind turbine. Regarding the electromagnetic compatibility of wind turbines, this is an unwanted effect. For example, it is known to use inverters having switching frequencies of 30 MHz or more, whose electromagnetic waves may thus travel through the tower as a wave guide. Other components, for example cooling aggregates, may also emanate such relevant electromagnetic waves.

SUMMARY

An aspect relates to provide a wind turbine having a better electromagnetic compatibility.

According to embodiments of the invention, an aspect relates to the tower comprising at least one absorber element at least reducing the transport of the electromagnetic wave of the power electronics component along the tower.

The inventors of embodiments of the current invention have recognized that the wind turbine tower may act as a wave guide for power electronics components in the lower part or below the tower, in particular an inverter, such that unwanted transport through the tower as a wave guide to the nacelle and thus unwanted emission of electromagnetic energy from the wind turbine may occur. To prevent or at least mitigate this effect, it is proposed to use one or more absorber elements, which can also be termed filter elements, inside the wave guide, in this case the tower. Simulations and experiments have shown that the usage of such absorber elements can greatly reduce electromagnetic emissions from the wind turbine, thus improving the electromagnetic compatibility.

The at least one absorber element is placed inside the tower, that is, in the path used by the electromagnetic wave and thus energy through the tower. Since the at least one absorber element comprises a material having a high relative permittivity, the electromagnetic energy will be at least in part absorbed by the at least one absorber element and be converted into heat. In other words, the tower, which has been identified as a possible wave guide, is transformed into a wave filter by using corresponding absorber elements, which may also be termed filter elements.

As is known from wave guide technology, the distribution of the electric and magnetic fields inside the wave guide may be calculated, thus also the amplitudes, in particular using a simulation and/or an analytical calculation. The result may be a map of the inside of the wave guide, in this case the tower, showing the amplitudes of the respective fields, in particular the electrical field, wherein these amplitudes may also be a mean over time if the distribution is not stationary. Of course, such values are dependent of the predefined tower geometry and the properties of the electromagnetic wave, in particular its frequency/wavelength. For such simulations/calculations, usually the at least one frequency of the electromagnetic wave generated by the power electronics component are used, since these electromagnetic waves are to be filtered.

The higher the amplitude of the electrical field is at the position of the at least one absorber element, the more energy can be absorbed/converted into heat.

While, regarding the choice of positions for the at least one absorber element, the simulation and/or calculation, of course, is performed without any absorber elements, it is possible to re-determine the electrical field distribution in the interior of the tower including the at least one absorber element to, in particular already in the design phase, assess the effect of the at least one absorber element.

Summing up, in other words, depending on the frequency of the electromagnetic wave and the dimensions of the wave guide, that is, the tower, there exist different areas with a high amplitude, that is, electrical field strength, of the electromagnetic wave, wherein the at least one absorber element is placed in at least one of these areas, which typically surrounds a local maximum of the electrical field strength.

For the sake of clarity, at this point, positioning of the at least one absorber element concerns placement along the longitudinal direction of the tower, that is, the height direction.

If multiple absorber elements are used, which is according to embodiments of the current invention, these multiple absorber elements are distanced by half the wavelength and/or a multiple of the wavelength of the electromagnetic wave generated by the power electronics component. In this manner, absorption of the energy of radiated emissions of the power electronics component is efficiently achieved.

As already mentioned, the at least one absorber element extends through the interior of the tower in a horizontal plane. In this respect, the absorber elements may also additionally serve as stabilizing elements of the tower, since they will in most cases connect opposing sides of the interior surface of the tower. In other words, the at least one absorber element is placed to fill at least a portion of the interior of the tower at least partly replacing the air inside the tower, where the electromagnetic wave propagates.

The concrete geometry of the at least one absorber element provides additional free parameters for adapting the absorbing, or filtering, respectively, function to the concrete properties of the electromagnetic wave to be absorbed. In particular, different geometries of the at least one absorber element may be chosen for different frequencies/wavelengths of the electromagnetic wave.

In concrete embodiments, at least one of the at least one absorber element may comprise or be a cylinder and/or at least one slab and/or may have a structured surface, in particular comprising a pyramidal shape. As already explained, different geometries can be used to suppress specific frequencies inside the wave guide. However, in particular in cases, where the absorber element is supposed to fulfill additional functions, for example stabilizing functions and/or platform functions, the design may also be governed by these additional functionalities. For example, if the at least one absorber element is additionally to be used as an intermediate platform in the tower, a slab-like geometry may be used.

In an embodiment, the at least one absorber element has at least one opening, in particular a through hole, and/or at least one opening in the center of the tower through which at least one cable is guided. Often, structures and/or objects extend in a height direction through the tower, for example cables connecting a generator located in the nacelle to the at least one power electronics component. Another example may be a ladder or other transportation devices for persons and/or objects. To accommodate for these structures, openings in the at least one absorber element may be provided, in particular a central opening, for example a through hole, in the middle of the tower for guiding cables, in particular along a cable guiding structure as in principle known in the art. The openings or hole may, however, also be placed off-center, for example when guiding cables. For a slab-like absorber element and central openings, for example, the absorber element may have the shape of a ring in the horizontal plane.

It should be noted at this point that embodiments of the current invention are not limited to cylindrical and/or rectangular towers, but any tower shape in which the tower acts as a wave guide in relevant frequency ranges can be provided with the at least one absorber element. It is further noted that in the case of multiple absorber elements, these may, of course, differ in geometry and/or orientation.

As has already been indicated, the absorber element is made from at least one electrically non-conductive material and/or at least one material having a high relative permittivity, in particular a relative permittivity greater than 30, or greater than 60 MHz.

In concrete embodiments, the material may, for example, comprise Barium titanate, wherein alloys or mixtures having a relative permittivity of 200 to 2200 may be used, and/or ferrites, in particular having a relative permittivity of 10000 to 40000, and/or polyvinyl alcohol acetate, having a relative permittivity smaller than 58.

In concrete embodiments, for example, if the power electronics component is an inverter, the power electronics component may be configured to perform a switching process generating the electromagnetic wave. As already mentioned above, inverters having switching frequencies of about 30 or 60 MHz have already been proposed in the state of the art. Conventional silicon-based slow switching IGBTs (silicon) having frequencies from 150 kHz to 100 MHz have already been described. Future SiC-IGBTs may have even faster switching times and thus higher frequencies.

In summary, it can be said that a lot of free parameters exist to customize the at least one absorber element, its geometry, material properties and/or its position such that electromagnetic waves of certain frequencies are sufficiently suppressed. In other words, the number, size, combination, material properties regarding absorption and position of absorber elements allows to control the absorbing effect and frequency which can be absorbed. It is noted at this point that, since radiation transported through the tower as a wave guide is emitted from structures at its top, for example the nacelle, it may in some cases even suffice to provide at least one absorber element at the top of the tower.

Embodiments of the invention also concerns a method for improving the electromagnetic compatibility of a wind turbine according to embodiments of the invention, which is characterized in that the at least one absorber element is used to reduce the transport of the electromagnetic wave of the power electronics component along the tower. All comments and features regarding the wind turbine also apply to the method according to embodiments of the invention.

In particular, the absorber element may be positioned in an area surrounding a position of maximum electrical field amplitude, neglecting the absorber element, of the electromagnetic wave for at least one wavelength of the electromagnetic wave in the tower. The at least one position of maximum electrical field amplitude is determined by a simulation and/or analytical calculation. Known electromagnetic simulation software may be used to perform simulations, for example the software known as CST studio, ANSYS and/or NX Magnetics.

It is finally noted that, in particular, by use of embodiments of the current invention, the tower is transformed into a so-called wave guide filter. The absorber elements, in this case, function as components of the filter, blocking the transport of certain frequencies which are generated by the power electronics component. As in embodiments of the current invention, in known wave guide filters dielectric elements may be used to realize the filtering function. Regarding suitable materials, it is also referred to the book "Dielectric Materials and Applications" by Arthur von Hippel, Artech House Inc., 1995.

BRIEF DESCRIPTION

Some of the embodiments will be described in detail, with reference to the following figures, wherein like designations denote like members, wherein.

DETAILED DESCRIPTION

Figure 1:
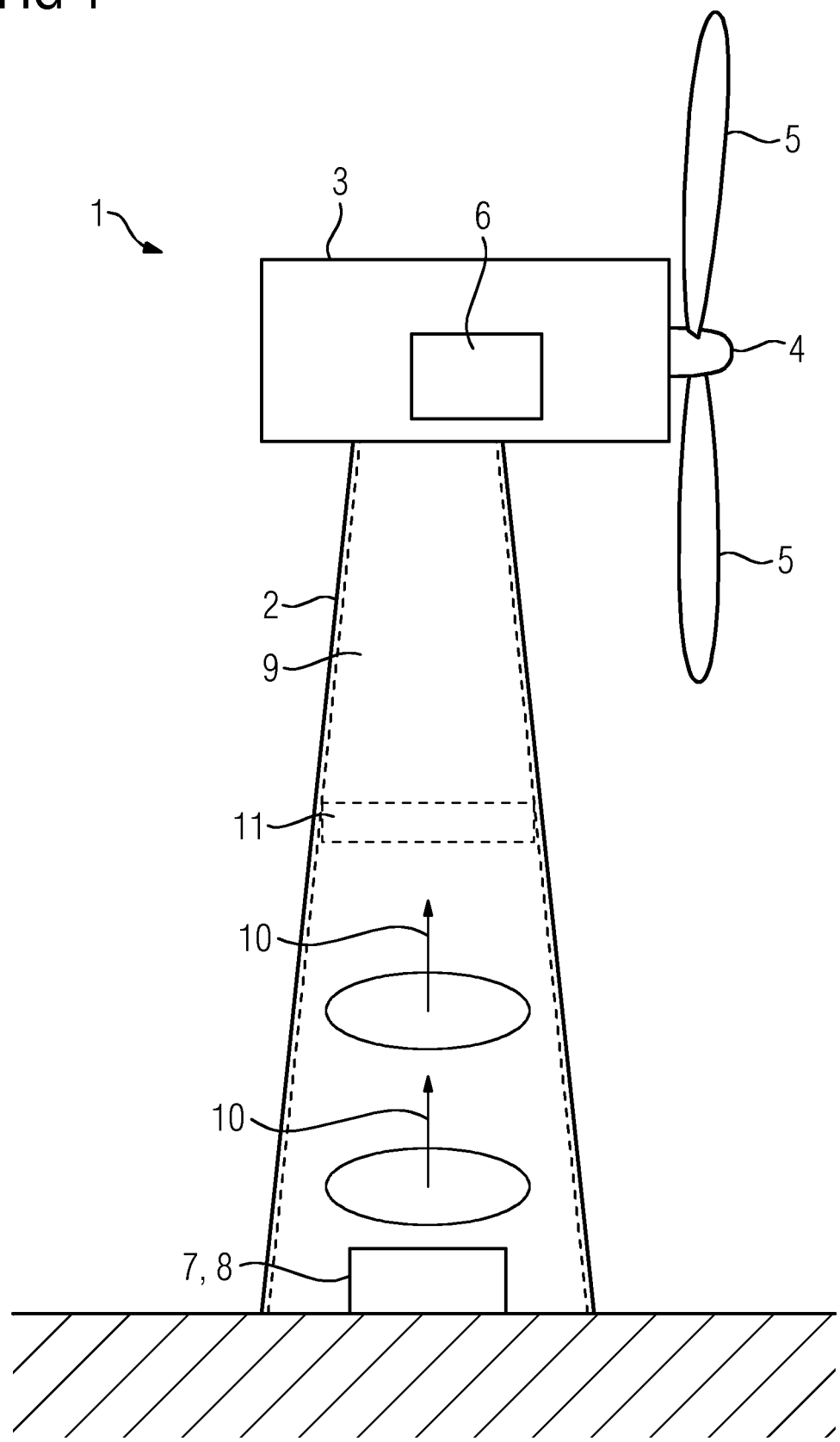
FIG. 1 shows a schematic general view of a wind turbine according to embodiments of the invention.

FIG. 1 is a schematic drawing of a wind turbine 1 according to embodiments of the present invention, in this case an onshore wind turbine 1. The wind turbine 1 comprises a tower 2 carrying a nacelle 3, to which the hub 4 with blades 5 is attached. A generator 6 is provided in the nacelle 3 and connected to at least one further power electronics component 7 at the bottom of the tower 2, in this case an inverter 8. To connect the inverter 8 and the generator 6, cables (not shown) are guided through the hollow interior 9 of the tower 2.

In an exemplary embodiment, the inverter 8 performs a switching process with a frequency of, for example, 30 MHz, such that electromagnetic waves of this frequency are emitted into the interior 9 of the tower 2. Since the dimensions of the tower 2 provide a cut-off frequency lower than 30 MHz, the tower 2 acts as a wave guide for these electromagnetic waves which propagate in the direction of the top of the tower 2, as indicated by arrows 10. For example, if an essentially cylindrical tower having a diameter of six meters is used, the cut-off frequency is about 29.6 Mhz.

To prevent the energy of the electromagnetic wave from reaching the nacelle 3, causing emissions from the wind turbine 1, or at least reduce its strength substantially, at least one absorber element 11 extending in a horizontal plane through the interior 9 of the tower 2 is provided, made from a non-conductive, that is, dielectric material having a high relative permittivity, in an example $\varepsilon_r$ equal to 82. At least one absorber element 11 is positioned in an area where relatively high amplitudes of the electrical field are present, in particular an area surrounding a position of a local maximum of the electrical field of the electromagnetic wave. Such positions/areas may, for example, be determined by simulating the propagation of electromagnetic waves of the relevant frequency through the tower 2 without having an absorber element 11, however, since further free parameters comprise the geometry, the relative permittivity and the number of absorber elements 11, further simulations and/or calculations may of course be undertaken already in a design phase to achieve optimum absorbing properties. Due to the placement of the at least one absorber element 11, energy from the electrical field is absorbed and converted into heat.

That is, by using the at least one absorber element 11, the tower 2 is transformed from a wave guide to a wave guide filter blocking at least the frequency of the electromagnetic wave emitted by the inverter 8. In this respect, the at least one absorber element 11 may also be termed filter element.

As already mentioned, the material properties, dimensions, position and number of absorber elements 11 provide multiple free parameters that may be adapted for optimum filter properties. In the case of multiple absorber elements 11, however, these are spaced from each other at half the wavelength of the electromagnetic wave to be absorbed in the tower 2 or multiples thereof.

FIGS. 3 to 10 show concrete embodiments of absorber elements 11 and their location in the interior 9 of the tower 2.

Figure 2:
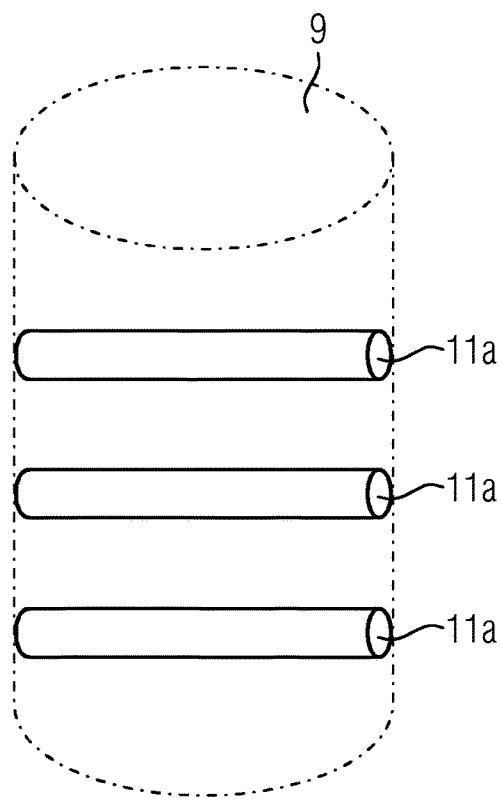
FIG. 2 shows absorber elements in the tower in a first embodiment.

In the first embodiment in FIG. 2, three cylindrical absorber elements 11a are provided in the interior 9 of the tower 2. It is noted that these absorber elements 11a may additionally be designed to have a stabilizing function, as is also true for stabilizer elements 11 of other embodiments.

Figure 3:
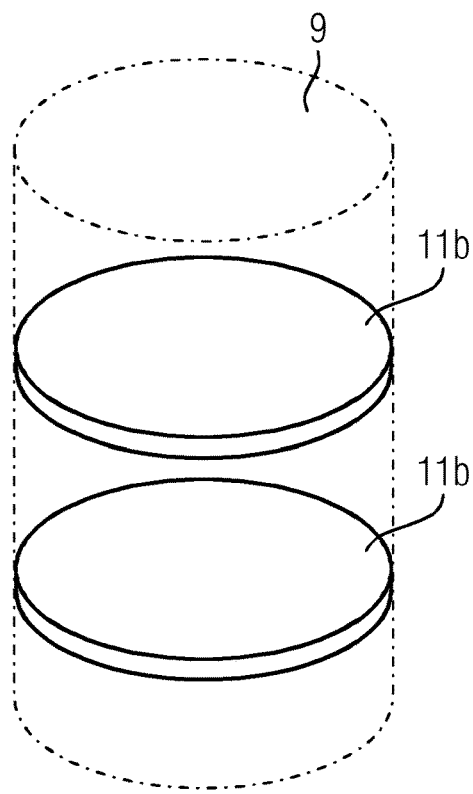
FIG. 3 shows absorber elements in the tower in a second embodiment.

FIG. 3 shows a second embodiment, in which two slab-like absorber elements 11b are used which extend over the whole cross-section of the tower 9.

Figure 4:
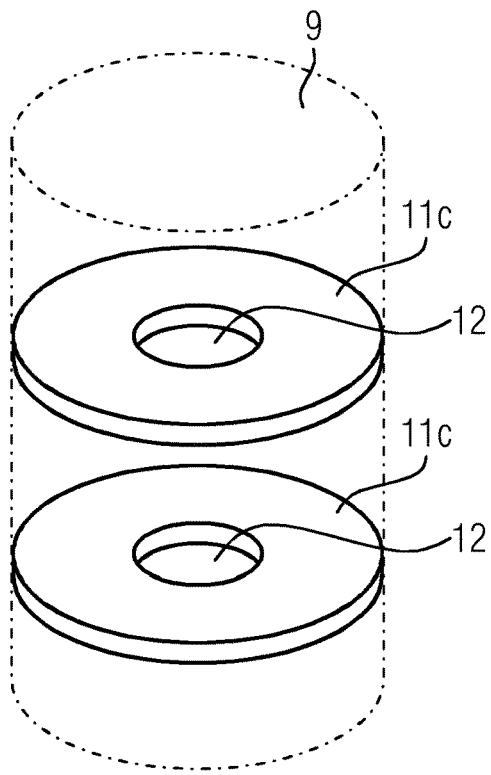
FIG. 4 shows absorber elements in the tower in a third embodiment.

FIG. 4 shows an embodiment in which the slab-like absorber elements 11c have a central opening 12 through which, for example, the cable may be guided along a cable guiding structure. An alternative use for these openings 12 and/or additional openings may be the transport of persons and/or objects inside the tower 2. Other embodiments may also have at least one non-central opening 12.

Figure 5:
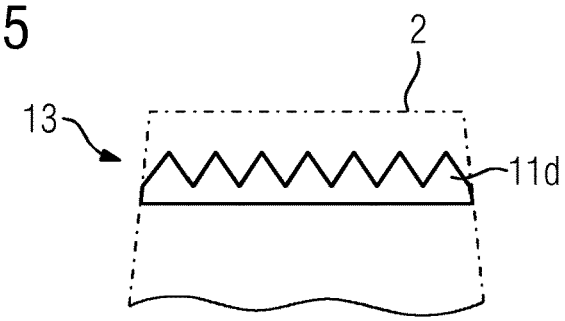
FIG. 5 shows absorber elements in the tower in a fourth embodiment.

FIG. 5 shows a fourth embodiment, in particular a cross-section at the top 13 of the tower 2. In this case, the absorber element 11d is positioned at the top of the tower 2 and comprises a pyramidal surface.

Figure 6:
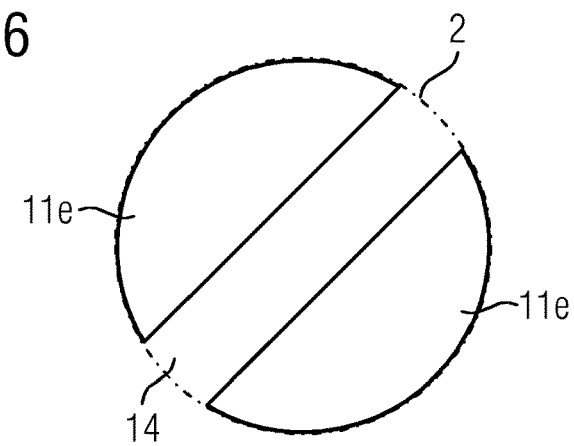
FIG. 6 is a cross section of the tower with an absorber element according to a fifth embodiment.

FIG. 6 shows another cross-section through the tower 2 in a horizontal plane. In this case, a two-part absorber element 11e comprises two slab-like parts separated by an opening 14.

While these embodiments referred to an essentially cylindrical tower 2, comparable or modified embodiments may also be used for rectangular towers. Examples for such embodiments are shown in FIGS. 7 to 10.

Figure 7:
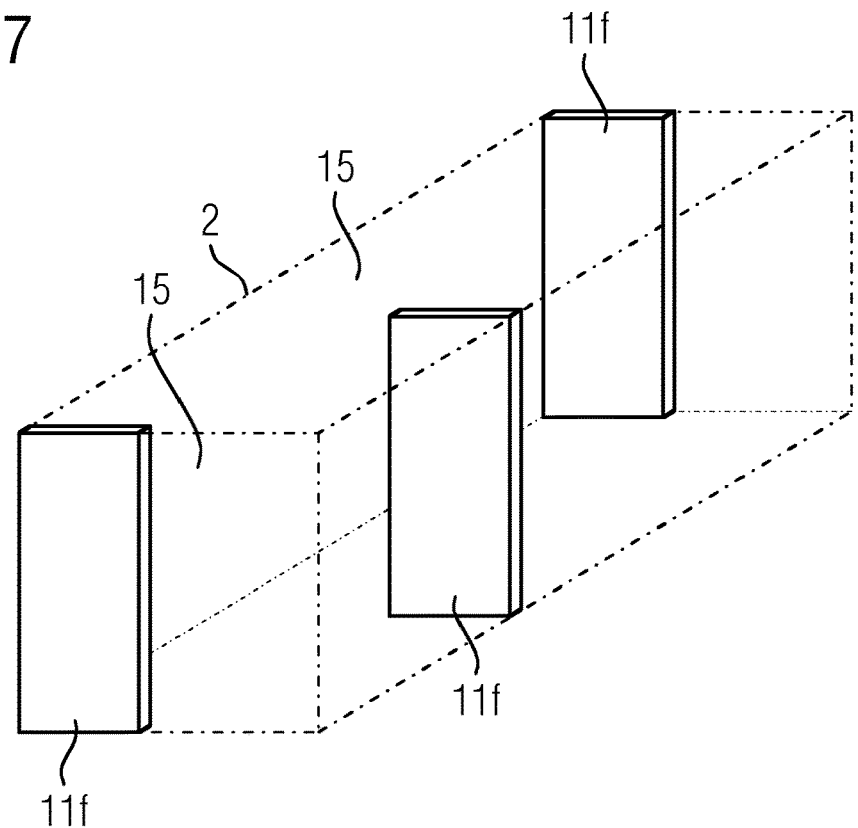
FIG. 7 shows absorber elements in the tower in a sixth embodiment.
Figure 8:
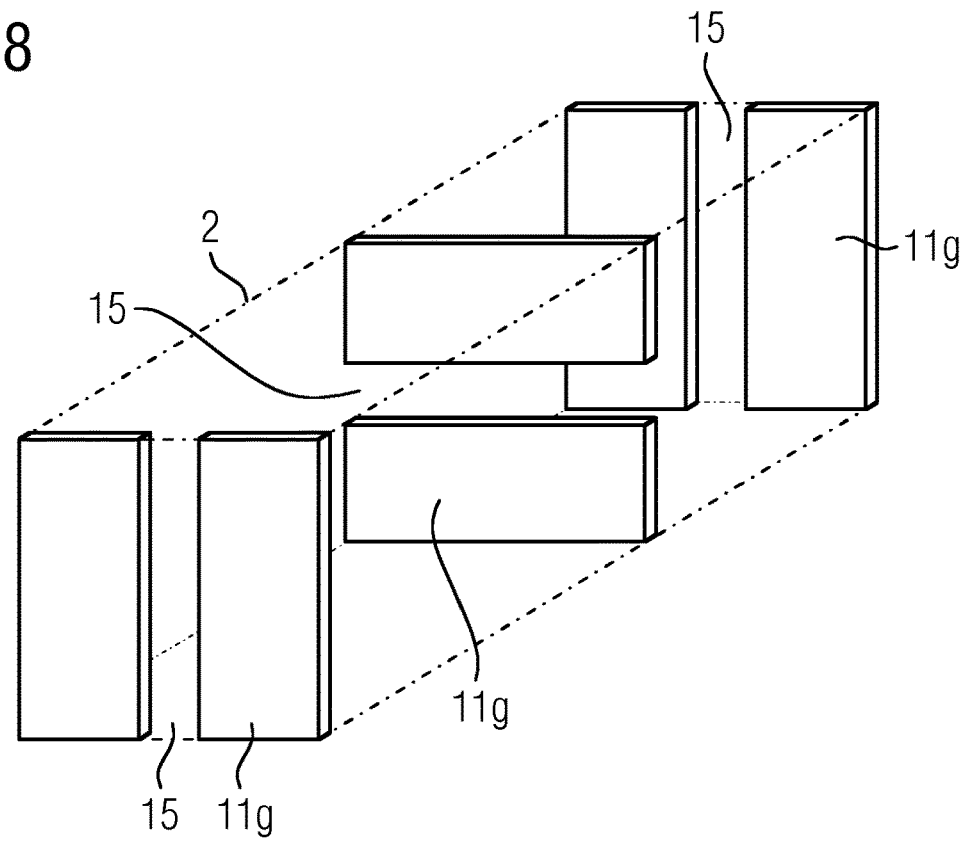
FIG. 8 shows absorber elements in the tower in a seventh embodiment.

FIG. 7 shows the use of slab-like absorber elements 11f which are shifted with respect to each other in an alternate manner. In FIG. 8, the two-part absorber elements 11g are alternatingly rotated by 90° with respect to each other. Note that, in both cases, openings 15 exist which can be used, for example, for guiding a cable or the like.

Figure 9:
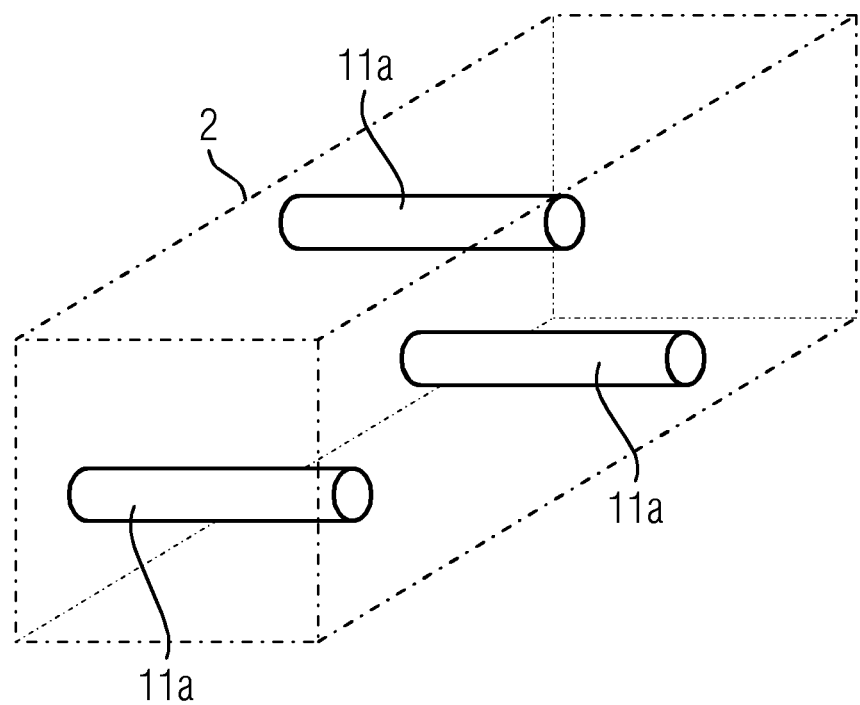
FIG. 9 shows absorber elements in the tower in an eighth embodiment.
Figure 10:
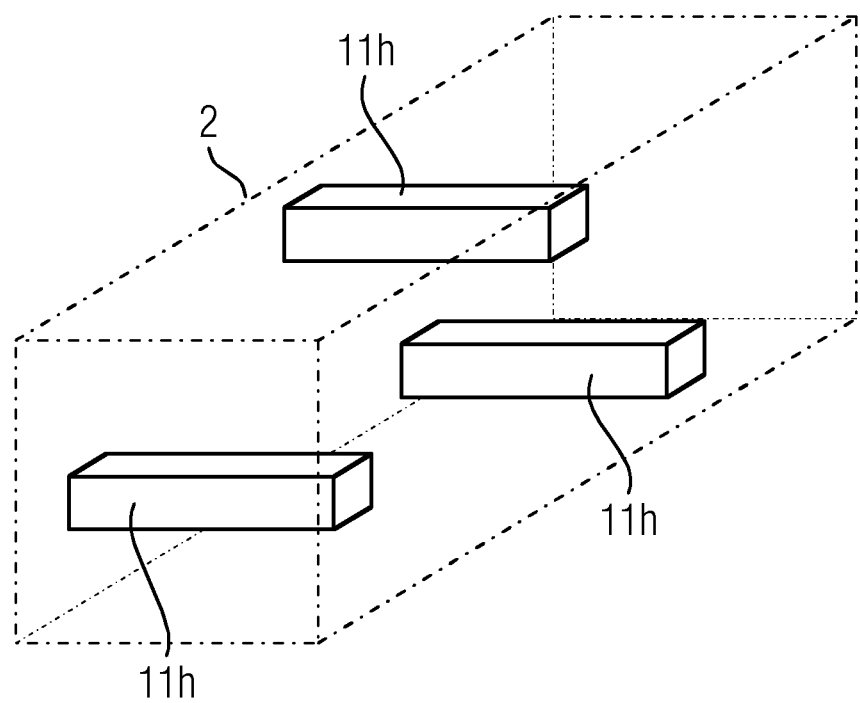
FIG. 10 shows absorber elements in the tower in a ninth embodiment.

In FIG. 9, the use of cylindrically shaped absorber elements 11a as known from FIG. 2 for a rectangular tower 2 is shown. According to FIG. 10, also beam-like absorber elements 11h having a rectangular cross-section may be used.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A wind turbine, comprising;
   a hollow tower carrying a nacelle, and
   at least one power electronics component emitting electromagnetic waves during operation,
   wherein the tower acts as a wave guide for an electromagnetic wave generated by the power electronics component,
   wherein the tower comprises at least one absorber element at least reducing the transport of the electromagnetic wave of the power electronics component along the tower, and
   wherein the at least one absorber element is provided in an area surrounding a position of maximum electrical field amplitude, neglecting the at least one absorber element, of the electromagnetic wave for at least a wavelength of the electromagnetic wave in the tower.

2. The wind turbine according to claim 1, wherein the at least one power electronics component emitting electromagnetic waves during operation is an inverter located at the bottom of the tower.

3. The wind turbine according to claim 1, wherein the at least one absorber element comprises multiple absorber elements, and wherein the multiple absorber elements are distanced by half the wavelength and/or a multiple thereof.

4. The wind turbine according to claim 1, wherein the power electronics component is configured to perform a switching process generating the electromagnetic wave.

5. The wind turbine according to claim 1, wherein the at least one absorber element is made from at least one electrically non-conductive material and/or at least one material having a relative permittivity greater than 30.

6. The wind turbine according to claim 5, wherein the material comprises Barium titanate and/or ferrites and/or polyvinyl alcohol acetate.

7. The wind turbine according to claim 1, wherein the at least one absorber element extends through the interior of the tower in a horizontal plane.

8. The wind turbine according to claim 7, wherein at least one of the at least one absorber element comprises or is a cylinder and/or at least one slab and/or has a structured surface and/or comprises a pyramidal shape.

9. The wind turbine according to claim 7, wherein the at least one absorber element has at least one opening, and/or at least one opening in the center of the tower through which at least one cable is guided.

10. A method for improving an electromagnetic compatibility of a wind turbine having a tower carrying a nacelle and at least one power electronics component emitting electromagnetic waves during operation, wherein the tower acts as a wave guide for an electromagnetic wave generated by the power electronics component, the method comprising:
    providing at least one absorber element in an area surrounding a position of maximum electrical field amplitude, neglecting the at least one absorber element, of the electromagnetic wave for at least one wavelength of the electromagnetic wave in the tower, such that the at least one absorber element reduces the transport of the electromagnetic wave of the power electronics component along the tower.

11. The method according to claim 10, wherein multiple absorber elements are provided.

12. The method according to claim 10, wherein the position of maximum electrical field amplitude is determined by a simulation and/or analytical calculation.

* * * * *